United States Patent [19]

Ohishi

[11] Patent Number: 4,868,508
[45] Date of Patent: Sep. 19, 1989

[54] TROUBLE DETECTING CIRCUIT FOR RESISTIVE SENSOR TYPE INDICATOR

[75] Inventor: Shigeru Ohishi, Shizuoka, Japan

[73] Assignee: Yazaki Corporation, Japan

[21] Appl. No.: 80,069

[22] Filed: Jul. 31, 1987

[30] Foreign Application Priority Data

Jul. 31, 1986 [JP] Japan .................. 61-116699[U]

[51] Int. Cl.⁴ .......................................... G01K 31/02
[52] U.S. Cl. .............................. 324/525; 204/401;
324/425; 324/537
[58] Field of Search ............. 324/549, 537, 525, 65 R,
324/425, 509, 522; 340/620, 618, 59; 73/304 R;
204/401

[56] References Cited

U.S. PATENT DOCUMENTS

| | | | |
|---|---|---|---|
| 4,166,243 | 8/1979 | West et al. | 324/537 |
| 4,167,163 | 11/1979 | Möder | 204/401 X |
| 4,203,142 | 5/1980 | Lee | 324/509 X |
| 4,224,606 | 9/1980 | Bartles | 73/304 R X |
| 4,267,505 | 5/1981 | Biglin | 324/525 X |
| 4,525,850 | 6/1985 | Miller | 73/304 R X |
| 4,622,844 | 11/1986 | Bienkowski | 204/401 X |

*Primary Examiner*—Reinhard J. Eisenzopf
*Assistant Examiner*—Robert W. Mueller
*Attorney, Agent, or Firm*—Wigman & Cohen

[57] ABSTRACT

In a resistive-sensor type indicator having a resistive sensor whose resistance changes according to a quantity to be measured and an indicator for indicating a sensor output voltage developed across the resistive sensor, when the resistive sensor is open due to disconnection or malconnection of the resistive sensor, the indicator indicates a maximum reading, thus resulting in a problem such that the user cannot recognize the abnormal state. To overcome this problem, a novel trouble detecting circuit is additionally incorporated in the indicator. The circuit comprises a comparator for outputting an abnormal signal when the sensor voltage exceeds a reference voltage and a transistor for grounding the resistive sensor in response to the abnormal signal. Therefore, the indicator indicates a minimum reading in case of resistive sensor trouble.

6 Claims, 2 Drawing Sheets

TROUBLE DETECTING CIRCUIT FOR RESISTIVE SENSOR TYPE INDICATOR

BACKGROUND OF THE INVENTION

1. Field of the Invention

The present invention relates to a trouble detecting circuit for a resistive-sensor type indicator which includes a resistive sensor whose resistance changes according to a quantity to be measured.

2. Description of the Prior Art

In the prior-art trouble detecting circuit for a resistive-sensor type indicator, when some trouble occurs, for instance such as disconnection of a resistive sensor, a slidable contact, a connector, etc. and therefore a resistive sensor incorporated in the trouble detecting circuit is disconnected open, a pointer of the indicator indicates the maximum value on the pointer scale. Therefore, there exists a problem in that the user cannot often recognize an occurrence of trouble in the resistive sensor type indicator.

The arrangements of the prior-art resistive-sensor type indicator will be described in more detail hereinafter with reference to the attached drawings under DETAILED DESCRIPTION OF THE PREFERRED EMBODIMENTS.

SUMMARY OF THE INVENTION

With these problems in mind, therefore, it is the primary object of the present invention to provide a trouble detecting circuit for a resistive-sensor type indicator, by which the presence of trouble can be readily recognized by the user because the indicator pointer indicates the minimum reading or zero on the pointer scale.

To achieve the above-mentioned object, a trouble detecting circuit for a resistive-sensor type indicator having a resistive sensor whose resistance changes according to a quantity to be measured and an indicator for indicating a sensor output voltage developed across the resistive sensor according to the present invention comprises: (a) means for comparing the sensor output voltage with a reference voltage and outputting a first signal indicative of a normal resistive sensor when the reference voltage exceeds the sensor output voltage and a second signal indicative of an abnormal resistive sensor when the sensor output voltage exceeds the reference voltage; and (b) means for controlling the sensor output voltage of said resistive sensor in such a way that said resistive sensor is connected to said indicator in response to the first signal to directly indicate a quantity to be measured on said indicator and to a substantially ground level in response to the second signal to indicate a minimum or maximum quantity on said indicator when said resistive sensor is in trouble.

The comparing means is an operational amplifier for outputting a normal L-voltage level signal when the reference voltage exceeds the sensor output voltage and an abnormal H-voltage level signal when the sensor output voltage exceeds the reference voltage.

Further, the comparing means is a Zener diode for outputting a normal L-voltage level signal when the reference Zener voltage exceeds the sensor output voltage and an abnormal H-voltage level signal when the sensor output voltage exceeds the reference Zener voltage.

Furthermore, the sensor output voltage controlling means is a transistor turned off in response to the first signal to directly indicate a quantity to be measured on the indicator and turned on in response to the second signal to indicate a ground voltage level on the indicator when the resistive sensor is in trouble.

Therefore, when the sensor output voltage is abnormally high, the operational amplifier or the Zener diode detects the abnormal sensor output voltage and therefore the transistor is turned on to ground the sensor output, so that the indicator indicates the minimum reading for providing an easy trouble recognition.

BRIEF DESCRIPTION OF THE DRAWING

The features and advantages of the trouble detecting circuit for a resistive-sensor type indicator according to the present invention over the prior art indicator will be more clearly appreciated from the following description of the preferred embodiments of the invention taken in conjunction with the accompanying drawings in which like reference numerals or symbols designate the same or similar elements or sections throughout the figures thereof and in which:

FIG. 1 (B) is a graphical representation showing the relationships between sensor resistance $R_S$ and sensor output voltage $V_S$;

DETAILED DESCRIPTION OF THE PREFERRED EMBODIMENTS

To facilitate understanding of the present invention, a brief reference will be made to a prior-art resistive-sensor type fuel indicator for an automotive vehicle, with reference to the attached drawings, by way of example.

Figure 1A:
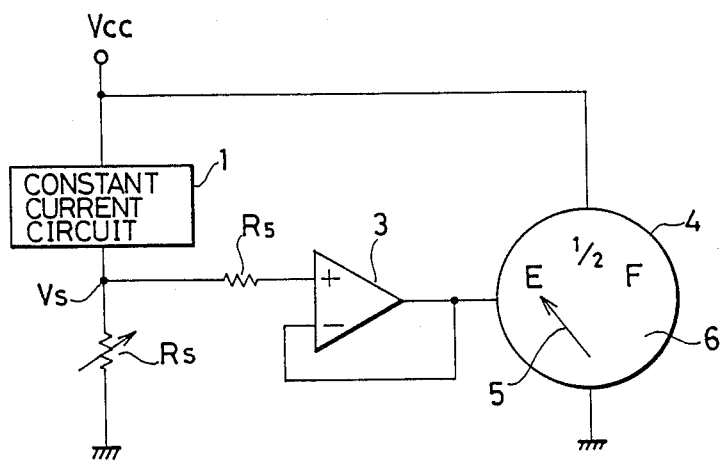
FIG. 1 (A) is a circuit diagram showing a prior-art resistive-sensor type indicator.

FIG. 1(A) shows a prior-art fuel indicator for indicating a residual quantity of fuel for an automotive vehicle. The prior-art resistive-sensor type indicator comprises a constant current circuit 1, a resistive fuel senor $R_S$, an impedance converter 3, and cross-coil indicator 4 including a pointer 5 and an indicator dial 6. The resistive fuel sensor $R_S$ is a variable resistance senor associated with a float. In this sensor $R_S$, the float is moved up and down according to liquid level of fuel, so that a slidable contact associated with the float and slidably connected to a fixed resistance indicates a resistance variable according to the fuel liquid level. The constant current circuit 1 is connected to the resistive sensor $R_S$ to supply a constant current from a supply voltage $V_{CC}$ to the resistive sensor $R_S$, so that a voltage drop (sensor output voltage $V_S$) develops across the resistive sensor $R_S$ in proportion to the resistance of the resistive sensor $R_S$. The sensor output voltage $V_S$ is applied to the meter-type cross-coil indicator 4 via a resistor $R_5$ and the impedance converter 3, to indicates a residual fuel quantity represented by the sensor output voltage $V_S$ proportional to the sensor resistance $R_S$ on an indicator dial 6 with the pointer 5.

Figure 1B:
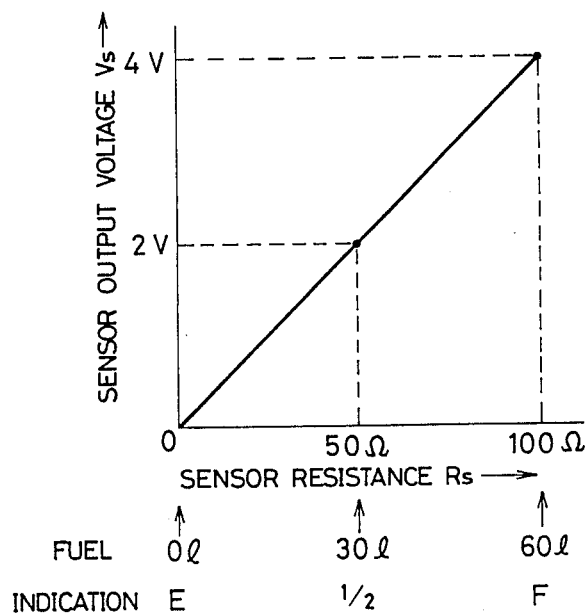

FIG. 1(B) shows the relationship between the sensor resistance $R_S$ and the sensor output voltage $V_S$, which indicates that the sensor output voltage $V_S$ is proportional to the sensor resistance $R_S$ representative of the residual quantity of fuel to be measured.

The impedance converter 3 is a voltage follower of operational amplifier having a high input impedance, a low output impedance and a gain of substantially 1. The high input impedance of the impedance converter 3 eliminates the influence of an external circuit (converter 3) upon the resistive sensor $R_S$, while the low output impedance thereof eliminates the influence of a change in impedance of the indicator 6 under impedance matching condition between the resistive sensor $R_S$ and the indicator 4.

In the above-mentioned prior-art resistive-sensor type indicator, in case trouble occurs such as disconnection of the resistive sensor $R_S$, malconnection of the slidable contact, malconnection of a connector between the resistive sensor $R_S$ and the indicator 4, since the resistive sensor $R_S$ is disconnected open, there exists a problem in that the sensor output voltage VS rises up to the supply voltage (e.g. 7 V) and therefore the pointer 5 indicates the maximum reading (e.g. F on the indicator dial 6). In other words, a driver who watches the indicator 4 cannot recognize the presence of trouble in the resistive sensor $R_S$. Therefore, where the indicator 4 is a residual fuel indicator, there exists a serious problem such that the driver overlooks sensor trouble and runs short of gasoline.

Figure 2:
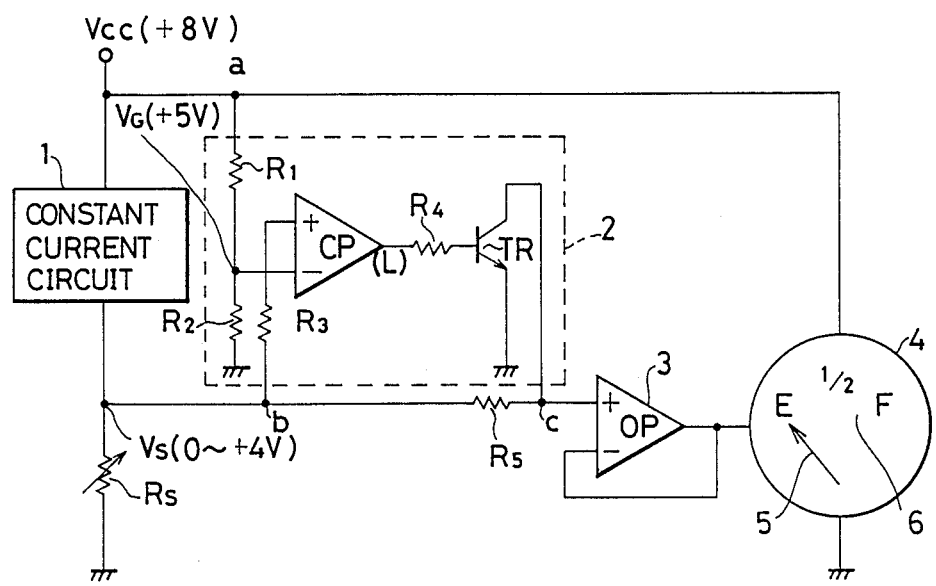
FIG. 2 is a circuit diagram showing a first embodiment of the trouble detecting circuit incorporated in a resistive-sensor type indicator, according to the present invention.

In view of the above description, reference is now made to a first embodiment of the trouble detecting circuit incorporated in a resistive-sensor type indicator according to the present invention, with reference to FIG. 2 in which the same references have been retained for similar parts having the same function as in FIG. 1(A), without repeating the description thereof.

In FIG. 2, a trouble detecting circuit 2 of the present invention is additionally connected across the resistor $R_5$ in order to control the sensor output voltage $V_S$ to be supplied to the indicator 4 on the basis of the sensor output voltage $V_S$.

In more detail, the trouble detecting circuit 2 is made up of a comparator CP, an N-P-N transistor TR, and four resistors $R_1$, $R_2$, $R_3$ and $R_4$.

A sensor output voltage $V_S$ is applied to a non-inversion (in-phase input) terminal + of the comparator CP via the resistor $R_3$. A reference voltage VG (e g. +5 V) obtained by dividing the supply voltage VCC (e.g. +8 V) by the two resistors $R_1$ and $R_2$ is applied to an inversion (out-of-phase input) terminal - of the comparator CP. An output of the comparator CP is connected to a base of the transistor TR via the resistor $R_4$. An emitter of the transistor TR is grounded and a collector thereof is connected to a non-inversion terminal + of the operational amplifier 3. In the above circuit connection, the junction point b between the resistive sensor $R_S$ and the non-inversion terminal of the comparator CP is connected as near the resistive sensor side of a connector for connecting between the resistive sensor $R_S$ and the indicator 4.

In the above circuit configuration, when a supply voltage $V_{CC}$ (e. g. 8 V) is applied to point a via a constant voltage circuit (not shown), a reference voltage $V_G$ (e g. 5 V) divided by the dividing resistor $R_1$ and $R_2$ is applied to the inversion terminal - of the comparator CP.

Further, as shown in FIG. 1(B), the sensor output voltage $V_S$ is determined to be less than 4 V, for instance.

Under the normal conditions, since the sensor output voltage $V_S$ within a range from 0 to +4 V and therefore is always lower than the reference voltage $V_G$=+5 V, the inversion input voltage VG is higher than the non-inversion input voltage $V_S$, so that the comparator CP outputs an L-voltage level signal. Consequently, the transistor TR is turned off, so that the trouble detecting circuit 2 is disconnected from the resistive sensor $R_S$ at point c ub/fug, 2. In other words, the sensor output voltage $V_S$ is directly supplied to the indicator 4 via the resistor $R_5$ and the impedance converter 3 to indicate the sensor output voltage $V_S$ on the indicator dial 6.

In contrast with this, under the abnormal conditions, since the sensor output voltage $V_S$ exceeds the reference voltage $V_G$=+5 V due to an increase in sensor resistance $R_S$ (the non-inversion terminal voltage $V_S$ exceeds the inversion terminal voltage $V_G$), the comparator CP outputs an H-voltage level signal. In response to this signal, the transistor TR is turned on, so that the non-inversion input terminal of the impedance converter 3 is grounded down to a zero voltage level via the transistor TR, thus the indicator pointer 5 indicating a zero reading on the indicator dial 6 (E in the case of the fuel indicator). Therefore, the user can recognize the occurrence of some trouble with the indicator.

Figure 3:
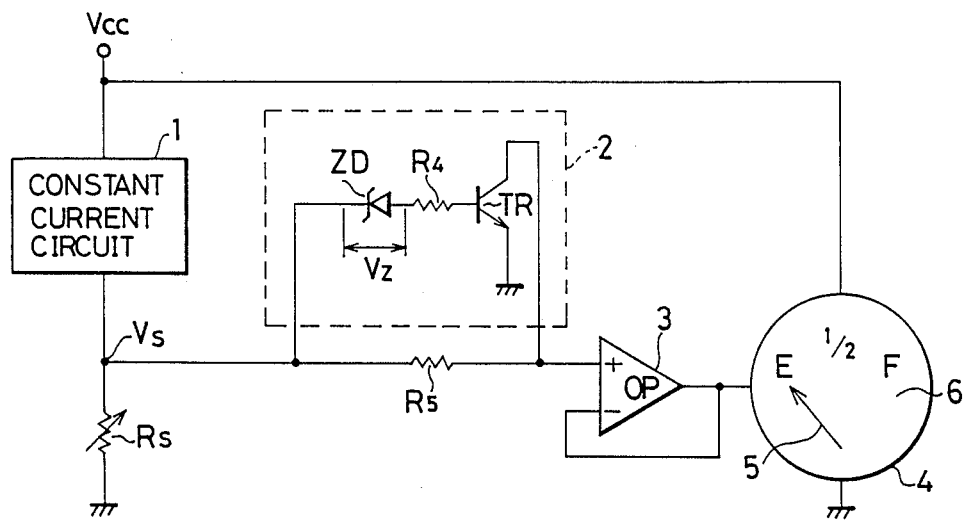
FIG. 3 is a circuit diagram showing a second embodiment of the trouble detecting circuit incorporated in a resistive-sensor type indicator, according to the present invention.

FIG. 3 is a second embodiment of the trouble detecting circuit according to the present invention, in which the comparator CP shown in FIG. 2 is replaced with a Zener diode ZD. That is, the sensor output voltage $V_S$ is applied to the base of the transistor TR via the Zener diode ZD and the resistor $R_4$. The Zener voltage $V_Z$ of the Zener diode ZD is determined equal or higher (e.g. 4 to 4.5 V) than the normal sensor output voltage $V_S$ (e g. 0 to 4 V).

Under the normal conditions, since the Zener voltage $V_Z \geq$ the sensor output voltage $V_S$, the Zener diode ZD is kept turned off, so that the transistor TR is turned off to disconnect the trouble detecting circuit 2 from the resistive sensor $R_S$. Accordingly, the sensor output voltage $V_S$ is directly applied to the indicator 4 via the impedance converter 3.

On the other hand, under the abnormal conditions, since the sensor output voltage $V_S \geq$ the Zener voltage $V_Z$ plus the base-emitter voltage $V_{be}$ of the transistor TR, the Zener diode ZD is turned on, so that the transistor TR is turned on to connect the trouble detecting circuit 2 to the resistive sensor $R_S$. Accordingly, the non-invention input terminal of the impedance converter 3 is grounded; as a result, the indicator pointer 5 indicates a zero reading.

In the above-mentioned indicators, a fuel indicator for an automotive vehicle has been described by way of example. However, without being limited to the fuel indicator, the trouble detecting circuit for an indicator according to the present invention can be applied to a coolant level sensor and a coolant temperature sensor for an automotive vehicle or to any other resistive-sensor type indicators. Further, in some indicators, it is also possible to indicate a maximum quantity on the indicator when the resistive sensor is in trouble. In this case, an inverter or the like is connected between the impedance converter 3 and the indicator 4.

As described above, in the trouble detecting circuit for a resistive-sensor type indicator according to the present invention, since the output terminal voltage of a resistive sensor to be applied to an indicator is grounded in case the resistive sensor is in trouble, it is possible to allow the indicator pointer to indicate a zero reading on the indicator dial and thereby to permit the user to readily recognize an occurrence of trouble or an abnormal state of the resistive sensor.

What is claimed is:

1. A trouble detecting circuit for a resistive-sensor type indicator having a resistive sensor whose resistance changes according to a quantity to be measured and an indicator for indicating a sensor output voltage developed across the resistive sensor, which comprises:
    (a) means for comparing the sensor output voltage with a reference voltage and outputting a first signal indicative of a normal resistive sensor when the reference voltage exceeds the sensor output voltage and a second signal indicative of an abnormal resistive sensor when the sensor output voltage exceeds the reference voltage; and
    (b) means for controlling the sensor output voltage of said resistive sensor in such a way that said resistive sensor is connected to said indicator in response to the first signal to directly indicate a quantity to be measured on said indicator and to a substantially ground level in response to the second signal to indicate a minimum quantity on said indicator when said resistive sensor is in trouble.

2. The trouble detecting circuit as set forth in claim 1, wherein said comparing means is an operational amplifier having an non-inversion input terminal connected to said resistive sensor and an inversion input terminal connected to a reference voltage, for outputting a normal L-voltage level signal when the reference voltage exceeds the sensor output voltage and an abnormal H-voltage level signal when the sensor output voltage exceeds the reference voltage.

3. The trouble detecting circuit as set forth in claim 1, wherein said comparing means is a Zener diode having a cathode electrode connected to said resistive sensor, for outputting a normal L-voltage level signal when the reference Zener voltage exceeds the sensor output voltage and an abnormal H-voltage level signal when the sensor output voltage exceeds the reference Zener voltage.

4. The trouble detecting circuit as set forth in claim 1, wherein said sensor output voltage controlling means is a transistor turned off in response to the first signal to directly indicate a quantity to be measured on said indicator and turned on in response to the second signal to indicate a ground voltage level when said resistive sensor is in trouble.

5. A trouble-detecting circuit for a resistive-sensor type indicator having a resistive sensor whose resistance changes according to a quantity to be measured and an indicator for indicating a sensor output voltage developed across the resistive sensor, which comprises:
    (a) an operational amplifier having a first input terminal connected to said resistive sensor and a second input terminal connected to a reference voltage, for outputting a normal signal when the reference voltage exceeds the sensor output voltage and an abnormal signal when the sensor output voltage exceeds the reference voltage; and
    (b) a transistor, connected between said operational amplifier and the indicator, turned off in response to the normal signal to directly indicate a quantity to be measured on said indicator to indicate a ground voltage level when said resistive sensor is in trouble.

6. A trouble detecting circuit for a resistive-sensor type indicator having a resistive sensor whose resistance changes according to a quantity to be measured and an indicator for indicating a sensor output voltage developed across the resistive sensor, which comprises:
    (a) a Zener diode having a cathode electrode connected to said resistive sensor, for outputting a normal signal when a reference Zener voltage exceeds the sensor output voltage and an abnormal signal when the sensor output voltage exceeds the reference Zener voltage; and
    (b) a transistor, connected between said operational amplifier and the indicator, turned of in response to the normal signal to directly indicate a quantity to be measured on said indicator and turned on in response to the abnormal signal to indicate a ground voltage level when said resistive sensor is in trouble.

* * * * *